(12) United States Patent
Tang et al.

(10) Patent No.: US 8,299,932 B2
(45) Date of Patent: Oct. 30, 2012

(54) CLOSED-LOOP MONITORING SYSTEM

(75) Inventors: Yi-Lin Tang, Tainan (TW); Nan-Jan Huang, Tainan (TW); Ruei-Cheng Liu, Yongkang (TW); Wang-Cheng Chen, Tainan (TW); Cheng-Chung Yeh, Yongkang (TW)

(73) Assignee: HICO Technology Co., Ltd., Tainan (TW)

( * ) Notice: Subject to any disclaimer, the term of this patent is extended or adjusted under 35 U.S.C. 154(b) by 728 days.

(21) Appl. No.: 12/537,190

(22) Filed: Aug. 6, 2009

(65) Prior Publication Data

US 2010/0039277 A1    Feb. 18, 2010

(30) Foreign Application Priority Data

Aug. 12, 2008   (TW) .............................. 97130674 A

(51) Int. Cl.
*G08B 21/00*   (2006.01)
*G08B 23/00*   (2006.01)
*G08B 26/00*   (2006.01)
*G05D 23/00*   (2006.01)
(52) U.S. Cl. ........ 340/635; 340/500; 340/505; 340/518; 340/507; 236/51
(58) Field of Classification Search .................... 340/635
See application file for complete search history.

(56) References Cited

U.S. PATENT DOCUMENTS

| | | | | |
|---|---|---|---|---|
| 4,276,603 A | * | 6/1981 | Beck et al. | 700/209 |
| 4,745,398 A | * | 5/1988 | Abel et al. | 340/500 |
| RE33,807 E | * | 1/1992 | Abel et al. | 340/500 |
| 2005/0143881 A1 | * | 6/2005 | Taulbut | 701/29 |
| 2006/0192666 A1 | * | 8/2006 | Parker et al. | 340/507 |
| 2007/0195958 A1 | * | 8/2007 | Czuchry | 380/277 |
| 2008/0042826 A1 | * | 2/2008 | Hevia et al. | 340/531 |
| 2008/0291625 A1 | * | 11/2008 | Rathbun et al. | 361/695 |
| 2009/0266904 A1 | * | 10/2009 | Cohen | 236/51 |

* cited by examiner

*Primary Examiner* — George Bugg
*Assistant Examiner* — Jack Wang
(74) *Attorney, Agent, or Firm* — Kilpatrick Townsend & Stockton LLP

(57) ABSTRACT

In a closed-loop monitoring system, a host device is operable to output encoded signals at a coupling side to a single transmission line. Each of monitoring devices includes: a current inducting generating unit generating induced encoded signals when the encoded signals pass through a signal current generating element coupled across an input side coupled to the transmission line; a control unit identifying a monitoring signal from the induced encoded signals generated by the current inducting generating unit; and a detecting unit detecting, in response to the monitoring signal, whether each of electronic devices coupled thereto is activated ox deactivated and transmitting a reply signal associated with states of the electronic devices to the transmission line based on a detection result made thereby. The host device receives the reply signal from each monitoring device through the transmission line and the coupling side to obtain state information associated with the electronic devices.

14 Claims, 4 Drawing Sheets

US 8,299,932 B2

CLOSED-LOOP MONITORING SYSTEM

CROSS-REFERENCE TO RELATED APPLICATION

This application claims priority to Taiwanese Application No. 097130674, filed Aug. 12, 2008, the disclosure of which is incorporated herein by reference.

BACKGROUND OF THE INVENTION

1. Field of the Invention

The invention relates to a monitoring system, more particularly to a closed-loop monitoring system.

2. Description of the Related Art

Referring to FIG. 1, a conventional control system is shown to include a host device 11, and a plurality of control devices 13 coupled in series to the host device 11 through a single transmission line 12. The host device 11 is operable to generate encoded audio signals and encoded control signals, and outputs the encoded audio signals and the encoded control signals to the transmission line 12 through an output side 111 thereof. Each control device 13 has an input side 131 coupled to the transmission line 12, and includes: a signal current generating element 132 coupled across the input side 131 such that the encoded audio and control signals pass through the signal current generating element 132; a current inducting device 133 disposed adjacent to the signal current generating element 132 for generating induced signals when the encoded audio and control signals pass through the signal current generating element 132; and a control unit 134 coupled to the current inducting device 133, an electronic device 15, such as a lamp device, and a loudspeaker 14, receiving the induced signals from the current inducting device 133, identifying audio signals and a control signal from the induced signals received thereby, and outputting the audio signals and the control signal to the loudspeaker 14 and the electronic device 15, respectively, such that the audio signals are reproduced by the loudspeaker 14 and that the electronic device 15 is operated based on the control signal.

In such a configuration, distortion of the encoded signals can be minimized, thereby ensuring a stable signal transmission. However, when undesired operation of one electronic device 15 occurs, a user cannot determine whether said one electronic device 15 malfunctions or the transmission line 12 is cut off. As a result, after said one electronic device 15 is checked and determined to be normal, a long period of time is required to find an exact position where the transmission line 12 is cut off.

SUMMARY OF THE INVENTION

Therefore, an object of the present invention is to provide a closed-loop monitoring system that can overcome the aforesaid drawbacks of the prior art.

According to one aspect of the present invention, a closed-loop monitoring system comprises:

a host device; and a plurality of monitoring devices coupled in series to the host device through a single transmission line such that the host device, the monitoring devices and the transmission line constitute a closed-loop structure.

The host device has a coupling side coupled to opposite ends of the transmission line, and includes a signal generating unit coupled to the coupling side, operable to generate encoded signals and outputting the encoded signals through the coupling side to the transmission line.

Each of the monitoring devices has an input side coupled to the transmission line and includes a signal current generating element coupled across the input side such that the encoded signals pass through the signal current generating element, a current inducting generating unit disposed adjacent to the signal current generating element for generating induced encoded signals when the encoded signals pass through the signal current generating element, a control unit coupled to the current inducting generating unit, receiving the induced encoded signals from the current inducting generating unit, identifying a monitoring signal from the induced encoded signals received thereby, and outputting the monitoring signal, and a detecting unit adapted to be coupled to a plurality of first electronic devices, coupled to the control unit for receiving the monitoring signal therefrom, detecting, in response to the monitoring signal received thereby, whether each of the first electronic devices is activated or deactivated, generating a reply signal associated with states of the first electronic devices based on a detection result made thereby, and transmitting the reply signal to the transmission line.

The host device further includes a processing unit coupled to the coupling side and receiving the reply signal from each of the monitoring devices through the transmission line and the coupling side such that the processing unit obtains state information associated with the first electronic devices coupled to each of the monitoring devices.

According to another aspect of the present invention, a closed-loop monitoring system comprises:

a host device; and a plurality of monitoring devices coupled in series to the host device through a single transmission line such that the host devices the monitoring devices and the transmission line constitute a closed-loop structure, each of the monitoring devices having an input side coupled to the transmission line and including a detecting unit adapted to be coupled to a plurality of electronic devices, detecting whether each of the electronic devices is activated or deactivated, generating a reply signal associated with states of the electronic devices based on a detection result made thereby, and transmitting the reply signal to the transmission line.

The host device has a coupling side coupled to opposite ends of said transmission line, and includes a processing unit coupled to the coupling side and receiving the reply signal from each of the monitoring devices through the transmission line and the coupling side such that the processing unit obtains state information associated with the electronic devices coupled to each of the monitoring devices.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
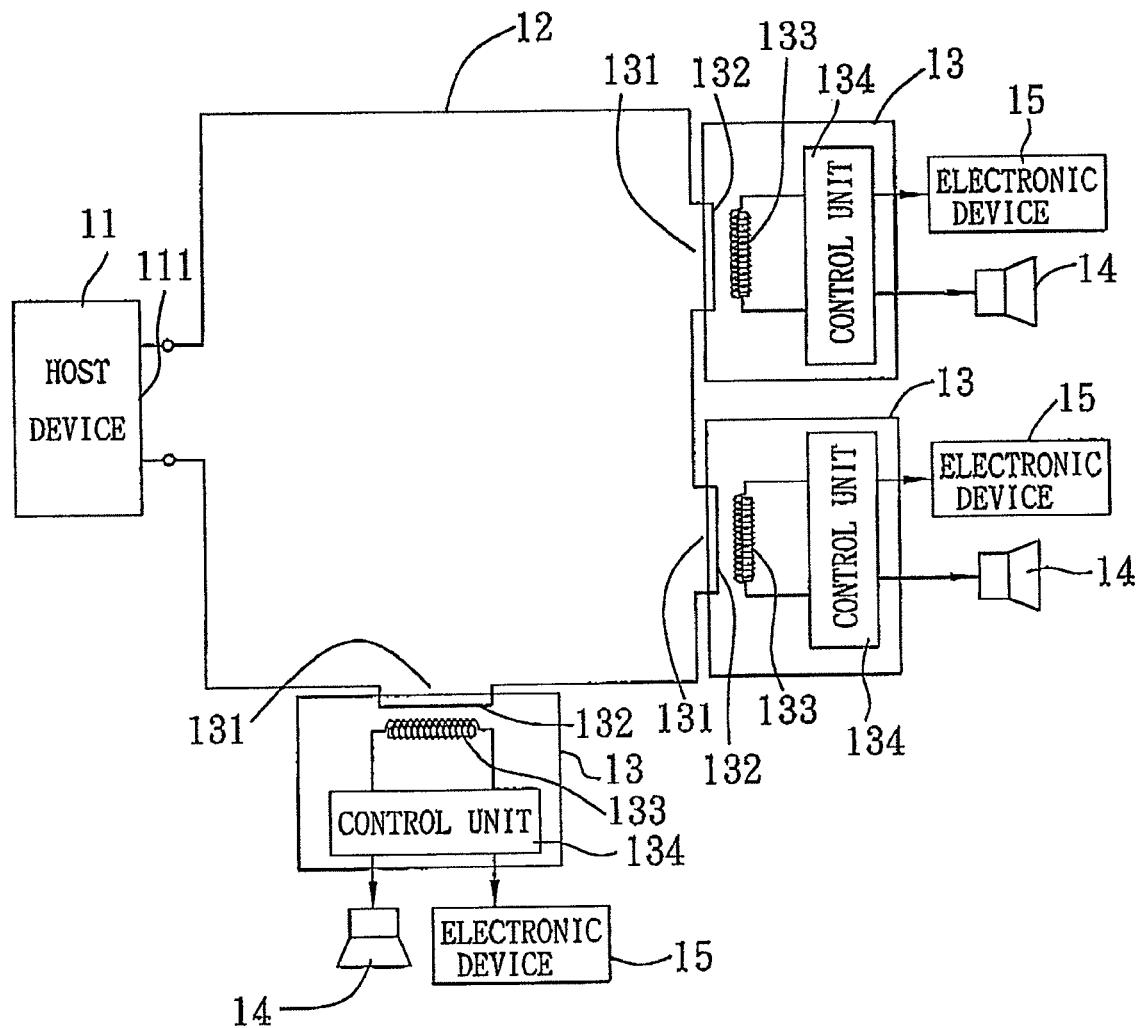
FIG. 1 is a schematic circuit block diagram illustrating a conventional control system.
Figure 2:
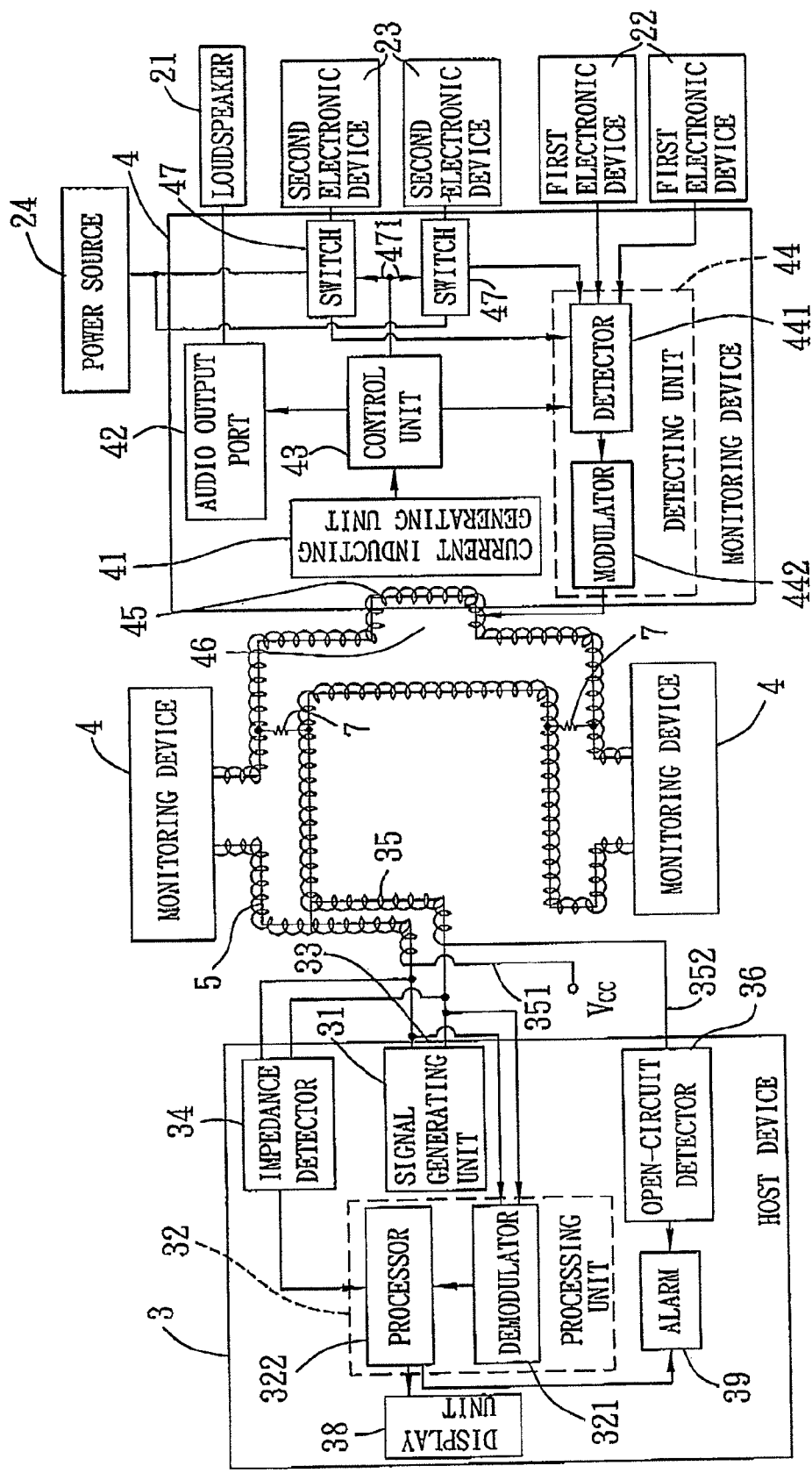
FIG. 2 is a schematic circuit block diagram illustrating the preferred embodiment of a closed loop monitoring system according to the present invention.

Referring to FIG. 2, the preferred embodiment of a closed-loop monitoring system according to the present invention is shown to include a host device 3, and a plurality of monitoring devices 4 coupled in series to the host device 3 through a single transmission line 5 such that the host device 3 and the monitoring devices 4 constitute a closed-loop structure. In this embodiment, each monitoring device 4 is adapted to be coupled to a loudspeaker 21, a plurality of first electronic devices 22, such as smoke detectors, gas 15 detectors or burglar alarms, and a plurality of second electronic devices 23, such as lamp devices or audio equipments. The closed-loop monitoring system is operable to transmit audio signals to the loudspeaker 21 coupled to each monitoring device 4, controls supply of electric power to the second electronic devices 23 coupled to each monitoring device 4, and detects states of the first electronic devices 22 coupled to each monitoring device 4.

The host device 3 has a coupling side 33 coupled to opposite ends of the transmission line 5. Each monitoring device 4 has an input side 46 coupled to the transmission line 5, and includes a signal current generating element 45 coupled across the input side 46. In this embodiment, the closed-loop monitoring system further includes a plurality of impedance elements 7 each having opposite ends coupled respectively to the coupling side 33 of the host device 3 and a common node of a corresponding adjacent pair of the monitoring devices 4. The impedance elements 7 are resistors having the same impedance that ranges from 10 KΩ to 10 MΩ. However, the impedance elements 7 are not limited to resistors having the same impedance.

The host device 3 includes a signal generating unit 31, an impedance detector 34, a processing unit 32, an open-circuit detecting unit, a display unit 38, and an alarm 39 in this embodiment.

The signal generating unit 31 is coupled to the coupling side 33, is operable to generate encoded signals, and outputs the encoded signals through the coupling side 33 to the transmission line 5. In this embodiment, the encoded signals include audio signals, control signals and monitoring signals.

The impedance detector 34 is coupled to the coupling side 33, detects an impedance across the coupling side 33, and outputs an impedance output based on a detection result made thereby.

The processing unit 32 includes a demodulator 321 coupled to the coupling side 33, and a processor 322 coupled to the demodulator 321 and the impedance detector 34 in this embodiment. The processor 322 receives the impedance output from the impedance detector 34, determines whether the transmission line 5 is cut off based on the impedance output received thereby, and obtains condition information indicating a section of the transmission line 5 that is discontinuous by analyzing the impedance output when the transmission line 5 is determined to be cut off.

The display unit 38 is coupled to the processor 322 for displaying the condition information thereon.

The alarm 39 is coupled to the processor 322, and is controlled by the processor 322 to generate an alarm output when the processor 322 determines that the transmission line 5 is cut off.

Figure 3:
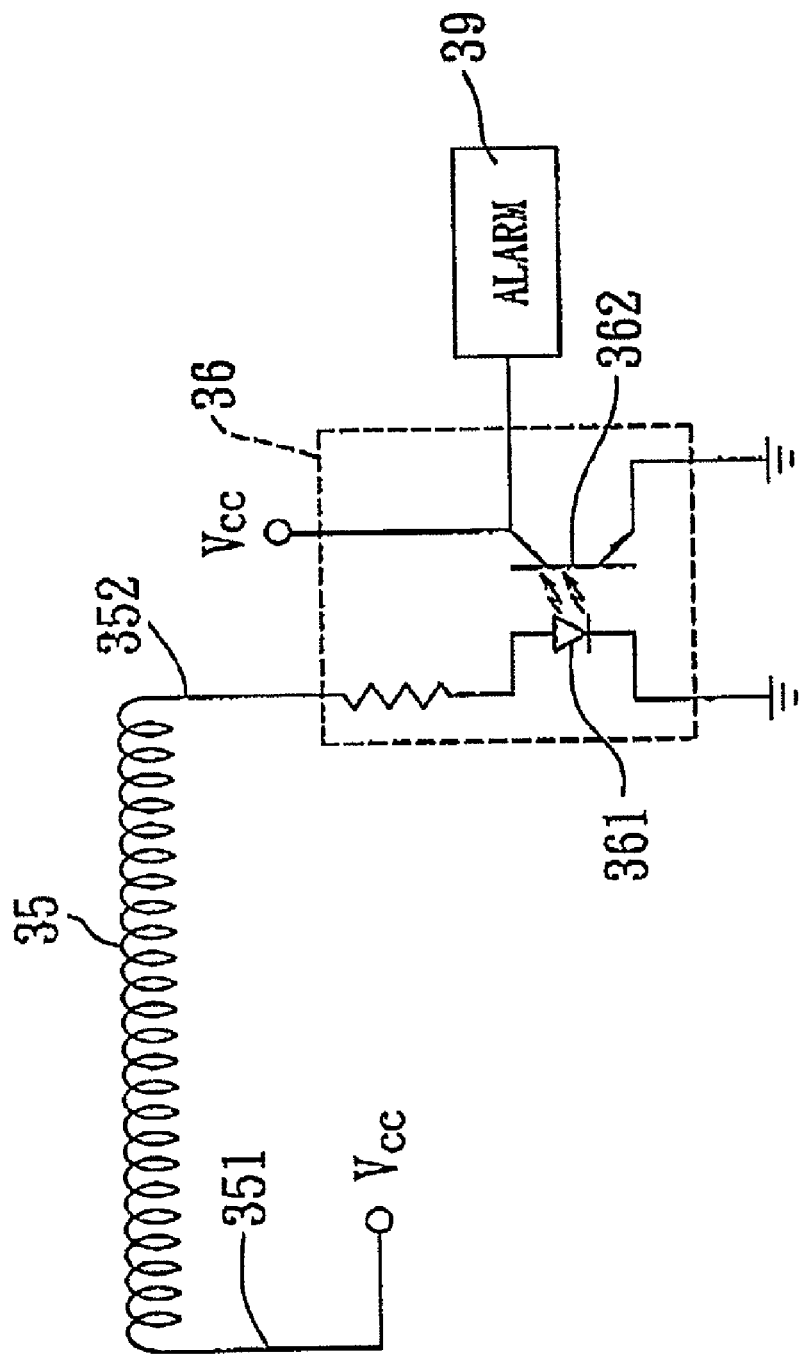
FIG. 3 is a schematic electrical circuit diagram illustrating an embodiment of an open-circuit detector of the preferred embodiment.

The open-circuit detecting unit includes a conductive element 35 and an open-circuit detector 36. The conductive element 35 is arranged closely along the transmission line 5 and the signal current generating elements 45 of the monitoring devices 4 such that the conductive element 35 is cut off when the transmission line 5 is cut off. The conductive element 35 is in the form of a coiled conductive wire wound around the transmission line 5 and the signal current generating elements 45 of the monitoring devices 4 in this embodiment, has a first end 351 adapted for receiving an external voltage ($V_{cc}$), such as a DC voltage ranging from 5V to 36V, and a second end 352 opposite to the first end 351, and outputs a voltage output at the second end 352. The voltage output has a high level when the conductive element 35 is not cut off, and is floating, e.g., equal to zero, when the conductive element 35 is cut off. The open-circuit detector 36 is coupled to the second end 352 of the conductive element 35 and the alarm 39, receives the voltage output from the second end 352 of the conductive element 35, and is operable to output an open-circuit signal then the voltage output is floating. Thus, the alarm 39 receives the open-circuit signal from the open-circuit detector 36, and generates an alarm output in the form of sound or light in response to the open-circuit signal received thereby. In this embodiment, referring further to FIG. 3, the open-circuit detector 36 includes an optical coupler composed of a light emitting diode 361 and a phototransistor 362. When the conductive element 35 is not cut off, the light emitting diode 361 conducts due to the external voltage ($V_{cc}$) outputted at the second end 352 and serving as the voltage output, and emits light such that the phototransistor 362 conducts. In this case, a collector of the phototransistor 362 coupled to the alarm 39 is grounded such that the alarm 39 is deactivated. On the other hand, when the conductive element 35 is cut off, the light emitting diode 361 does not conduct such that the phototransistor 362 does not conduct. In this case, an external voltage ($V_{cc}$) serving as the open-circuit signal is applied to the alarm 39 such that the alarm 39 is activated to generate the alarm output.

Figure 4:
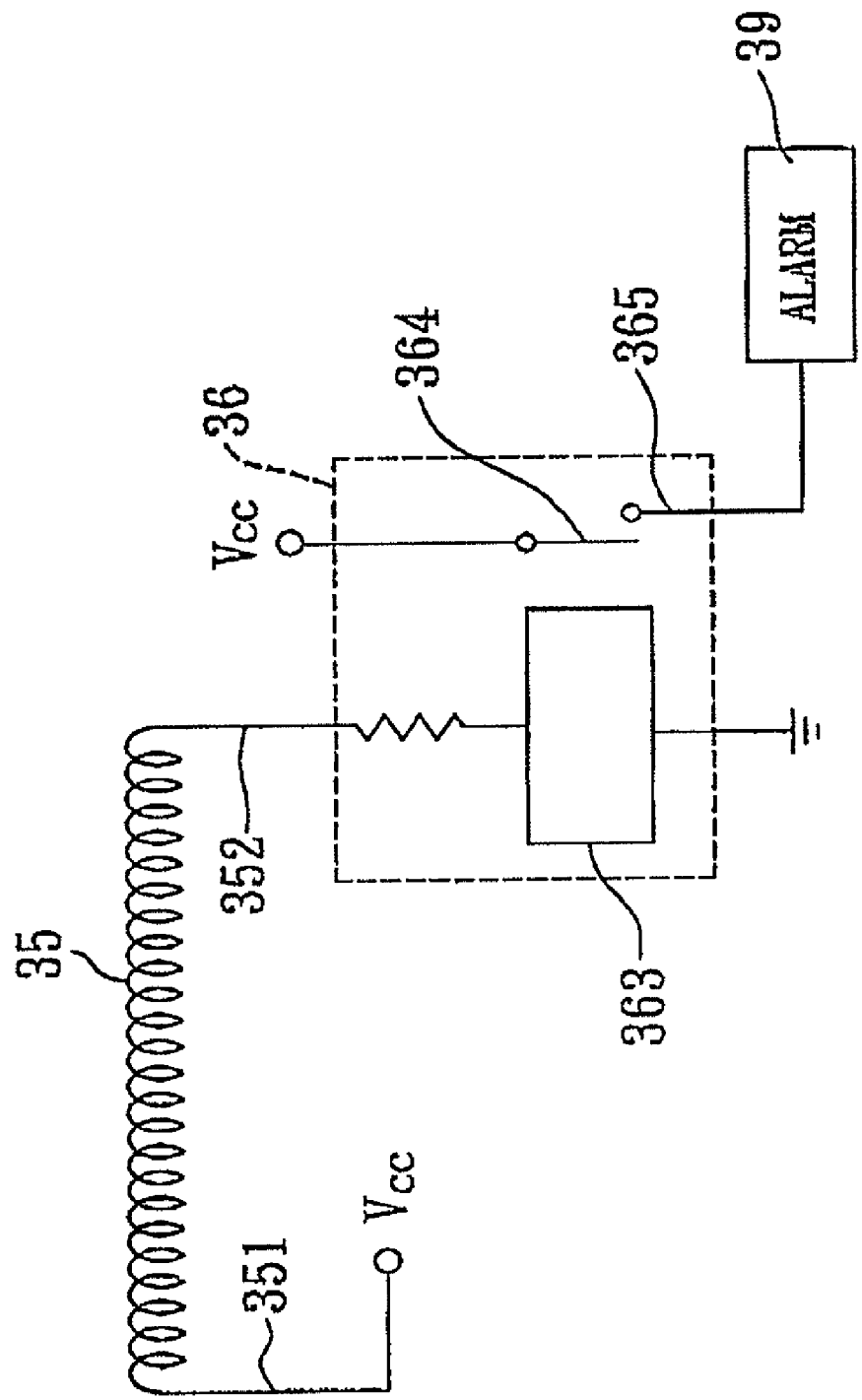
FIG. 4 is a schematic electrical circuit diagram illustrating another embodiment of the open-circuit detector of the preferred embodiment.

In another embodiment, referring to FIG. 4, the open-circuit detector 36 includes a relay in the form of a normally-open switch coupled between an external voltage ($V_{cc}$) and the alarm 39. The relay includes an electromagnetic coil 363, a magnetically attractable resilient movable electrode 364 coupled to the external voltage ($V_{cc}$), and a fixed electrode 365 coupled to the alarm 39. When the conductive element 35 is not cut off, the electromagnetic coil 363 is excited to generate a magnetic field such that the movable electrode 364 is attracted to move toward the electromagnetic coil 363 and is spaced apart from the fixed electrode 365. In this case, the alarm 39 is deactivated. On the other hand, when the conductive element 35 is cut off, the electromagnetic coil 363 is not excited, and the movable electrode 364 moves back toward and contacts the fixed electrode 365 as a result of a restoration force thereof. As a result, an external voltage ($V_{cc}$) serving as the open-circuit signal is applied to the alarm 39 such that the alarm 39 is activated to generate the alarm output.

In this embodiment, each monitoring device 4 further includes a current inducting generating unit 41, an audio output port 42, a control unit 43, a detecting unit 44, and a plurality of switches 47.

For each monitoring device 4, the current inducting generating unit 41 is disposed adjacent to the signal current generating element 45 for generating induced encoded signals when the encoded signals pass through the signal current generating element 45.

The audio output port 42 is adapted to be coupled to the loudspeaker 21.

The control unit 43 is coupled to the current inducting generating unit 41 and the audio output port 42, receives the induced encoded signals from the current inducting generating unit 41, identifies audio signals, a control signal and a monitoring signal from the induced encoded signals received thereby, and outputs the audio signals, the control signal and the monitoring signal, wherein the audio signals are outputted to the loudspeaker 21 through the audio output port 42 such that the loudspeaker 21 reproduces the audio signals.

Each switch 47 is adapted to be coupled between a power source 24 and the corresponding second electronic device 23, has a control end 471 coupled to the control unit for receiving the control signal therefrom, and is operable, in response to the control signal, between an ON-mode, where electric power from the power source 24 is supplied to the corresponding second electronic device 23, and an OFF-mode, where the electric power from the power source 24 is not supplied to the corresponding second electric device 23.

In this embodiment, the detecting unit 44 includes a detector 441 and a modulator 442. The detector 441 is coupled to the control unit 43, the switches 47 and the first electronic devices 22, receives the monitoring signal from the control unit 43, detects, in response to the monitoring signal received thereby, whether each first electronic device 22 is activated or deactivated and operation of each switch 47, and generates a detecting output based on a detection result made thereby. The modulator 442 is coupled to the detector 441 and the transmission line 5, receives the detecting output from the detector 441, modulates the detecting output received thereby so as to generate a reply signal that is associated with states of the first electronic devices 22 and an operating mode of the switches 47 and that is in the form of carrier waves, and transmits the reply signal to the coupling side 33 of the host device 3 through the transmission line 5. It is noted that, in other embodiments, the detecting unit 44 of each monitoring device 4 can automatically detect the first electronic devices 22 coupled thereto regardless of the monitoring signal received thereby.

Thus, the demodulator 321 of the processing unit 32 of the host device 3 receives and demodulates the reply signal from each monitoring device 4, and outputs the reply signal demodulated thereby to the processor 322 such that the processor 322 obtains state information associated with the first electronic devices 22 coupled to each monitoring device 4 and operating mode information associated with the switches 47 of each monitoring device 4 based on the reply signal received thereby. The display unit 38 further displays the state information and the operating mode information corresponding to the reply signal from each monitoring device 4 thereon.

In sum, due to the presence of the open-circuit detecting unit and the alarm 39, cutting off of the transmission line 5 can be promptly detected and a user can be alarmed. Furthermore, due to the presence of the impedance detector 34 and the impedance elements 7, the processing unit 32 of the host device 3 can obtain the condition information indicating the discontinuous section of the transmission line 5 when the transmission line 5 is cut off, thereby reducing a time period required for checking and repairing the transmission line 5. Therefore, the closed-loop monitoring system of the present invention can effectively monitor operation of the first and second electronic devices 22, 23 coupled to each monitoring device 4 through the condition information, the state information and the operating mode information displayed on the display unit 38.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A closed-loop monitoring system comprising:
   a host device; and
   a plurality of monitoring devices coupled in series to said host device through a single transmission line such that said host device, said monitoring devices and said transmission line constitute a closed-loop structure;
   wherein said host device has a coupling side coupled to opposite ends of said transmission line, and includes a signal generating unit coupled to said coupling side, operable to generate encoded signals and outputting the encoded signals through said coupling side to said transmission line;
   each of said monitoring devices having an input side coupled to said transmission line and including
      a signal current generating element coupled across said input side such that the encoded signals pass through said signal current generating element,
      a current inducting generating unit disposed adjacent to said signal current generating element for generating induced encoded signals when the encoded signals pass through said signal current generating element,
      a control unit coupled to said current inducting generating unit, receiving the induced encoded signals from said current inducting generating unit, identifying a monitoring signal from the induced encoded signals received thereby, and outputting the monitoring signal, and
      a detecting unit adapted to be coupled to a plurality of first electronic devices, coupled to said control unit for receiving the monitoring signal therefrom, detecting, in response to the monitoring signal received thereby, whether each of the first electronic devices is activated or deactivated, generating a reply signal associated with states of the first electronic devices based on a detection result made thereby, and transmitting the reply signal to said transmission line; and
   said host device further including a processing unit coupled to said coupling side and receiving the reply signal from each of said monitoring devices through said transmission line and said coupling side such that said processing unit obtains state information associated with the first electronic devices coupled to each of said monitoring devices.

2. The closed-loop monitoring system as claimed in claim 1, wherein:
   said control unit of each of said monitoring devices further identifies a control signal from the induced encoded signals received thereby, and outputs the control signal;
   each of said monitoring devices further includes a plurality of switches each adapted to be coupled between a power source and a second electronic device, having a control end coupled to said control unit for receiving the control signal therefrom and operable, in response to the control signal, between an ON-mode, where electric power from the power source coupled thereto is supplied to the second electronic device coupled thereto, and an OFF-mode, where the electric power from the power source coupled thereto is not supplied to the second electronic device coupled thereto;
   said detecting unit of each of said monitoring devices is coupled to said switches, and further detects operation of each of said switches in response to the monitoring signal received thereby such that the reply signal generated by said detecting unit is further associated with an operating mode of said switches; and said processing unit of said host device further obtains operating mode information associated with said switches of each of said monitoring devices.

3. The closed-loop monitoring system as claimed in claim 2, wherein said host device further includes a display unit coupled to said processing unit for displaying the state information and the operating mode information corresponding to the reply signal from each of said monitoring devices thereon.

4. The closed-loop monitoring system as claimed in claim 3, further comprising a plurality of impedance elements each having opposite ends coupled respectively to said coupling side of said host device and a common node of a corresponding adjacent pair of said monitoring devices;

wherein said host device further includes an impedance detector coupled to said coupling side and said processing unit, detecting an impedance across said coupling side, and outputting an impedance output to said processing unit based on a detection result made thereby;

said processing unit of said host device receiving the impedance output from said impedance detector, determining whether said transmission line is cut off based on the impedance output received thereby, and obtaining condition information indicating a section of said transmission line that is discontinuous by analyzing the impedance output when said transmission line is determined to be cut off; and said display unit of said host device further displaying the condition information thereon.

5. The closed-loop monitoring system as claimed in claim 4, wherein said impedance elements have the same impedance.

6. The closed-loop monitoring system as claimed in claim 5, wherein the impedance of said impedance elements ranges from 10 KΩ to 10 MΩ.

7. The closed-loop monitoring system as claimed in claim 2, wherein said detecting unit of each of said monitoring devices includes:

a detector coupled to said switches and said first electronic devices, detecting the states of the first electronic devices and the operating modes of said switches, and generating a detecting output based on the detection result made thereby; and a modulator coupled to said detector and said transmission line, receiving the detecting output from said detector, and modulating the detecting output received thereby so as to generate the reply signal that is in the form of carrier waves transmitted to said coupling side of said host device through said transmission line.

8. The closed-loop monitoring system as claimed in claim 7, wherein said processing unit of said host device includes:

a demodulator coupled to said coupling side for receiving and demodulating the reply signal from each of said monitoring devices, and outputting the reply signal demodulated thereby;

a processor coupled to said demodulator, receiving the reply signal from said demodulator, and obtaining the state information and the operating mode information corresponding to the reply signal from each of said monitoring devices, said processor determining whether said transmission line is cut off based on the reply signals demodulated by said demodulator, and obtaining condition information indicating a section of said transmission line that is discontinuous by analyzing the reply signals when said transmission line is determined to be cut off; and a display unit coupled to said processor for displaying the condition information, and the state information and the operating mode information corresponding to the reply signal from each of said monitoring devices thereon.

9. The closed-loop monitoring system as claimed in claim 8, wherein said host device further includes an alarm coupled to said processor and controlled by said processor to generate an alarm output when said processor determines that said transmission line is cut off.

10. The closed-loop monitoring system as claimed in claim 2, wherein said host device further includes:

an open-circuit detecting unit including
a conductive element arranged closely along said transmission line and said signal current generating elements of said monitoring devices such that said conductive element is cut off when said transmission line is cut off, having a first end adapted for receiving an external input voltage, and a second end opposite to said first end, and outputting a voltage output at said second end, the voltage output having a high level when said conductive element is not cut off, and being floating when said conductive element is cut off, and
an open-circuit detector coupled to said second end of said conductive element for receiving the voltage output therefrom, and operable to output an open-circuit signal when the voltage output is floating; and an alarm coupled to said open-circuit detector for receiving the open-circuit signal therefrom, and generating an alarm output in response to the open-circuit signal received thereby.

11. The closed-loop monitoring system as claimed in claim 10, wherein said conductive element is in the form of a coiled conductive wire wound around said transmission line and said signal current generating elements of said monitoring devices.

12. The closed-loop monitoring system as claimed in claim 10, wherein said open-circuit detector includes an optical coupler.

13. The closed-loop monitoring system as claimed in claim 10, wherein said open-circuit detector includes a relay.

14. A closed-loop monitoring system comprising:

a host device; and a plurality of monitoring devices coupled in series to said host device through a single transmission line such that said host device, said monitoring devices and said transmission line constitute a closed-loop structure, each of said monitoring devices having an input side coupled to said transmission line and including a detecting unit adapted to be coupled to a plurality of electronic devices, detecting whether each of the electronic devices is activated or deactivated, generating a reply signal associated with states of the electronic devices based on a detection result made thereby, and transmitting the reply signal to said transmission line;

wherein said host device has a coupling side coupled to opposite ends of said transmission line, and includes a processing unit coupled to said coupling side and receiving the reply signal from each of said monitoring devices through said transmission line and said coupling side such that said processing unit obtains state information associated with the electronic devices coupled to each of said monitoring devices.

* * * * *